US010514290B2

(12) United States Patent
Sharma et al.

(10) Patent No.: US 10,514,290 B2
(45) Date of Patent: Dec. 24, 2019

(54) CAPACITANCE SENSING APPARATUS AND METHOD FOR DETECTING GAS-LIQUID TRANSITIONS

(71) Applicant: Flowserve Management Company, Irving, TX (US)

(72) Inventors: Akshat Sharma, Houston, TX (US); Peter Charles Cornwell, Houston, TX (US); Ruihua Xie, Houston, TX (US)

(73) Assignee: Flowserve Management Company, Irving, TX (US)

( * ) Notice: Subject to any disclaimer, the term of this patent is extended or adjusted under 35 U.S.C. 154(b) by 155 days.

(21) Appl. No.: 15/792,981

(22) Filed: Oct. 25, 2017

(65) Prior Publication Data

US 2019/0120679 A1   Apr. 25, 2019

(51) Int. Cl.
*G01F 23/26* (2006.01)
*G01F 1/74* (2006.01)
*G01R 27/26* (2006.01)

(52) U.S. Cl.
CPC .............. *G01F 23/266* (2013.01); *G01F 1/74* (2013.01); *G01F 23/263* (2013.01); *G01F 23/268* (2013.01); *G01R 27/2605* (2013.01)

(58) Field of Classification Search
CPC .................................................. G01F 23/266
See application file for complete search history.

(56) References Cited

U.S. PATENT DOCUMENTS

| 4,806,847 | A  | 2/1989 | Atherton et al. |
| 8,215,166 | B2 | 7/2012 | Cunningham et al. |

| 2003/0000303 | A1* | 1/2003 | Livingston | G01F 23/266 |
| | | | | 73/304 C |
| 2004/0149032 | A1* | 8/2004 | Sell | G01F 23/263 |
| | | | | 73/304 C |
| 2009/0199635 | A1* | 8/2009 | Jacobson | G01F 23/268 |
| | | | | 73/304 C |

(Continued)

FOREIGN PATENT DOCUMENTS

WO   20120062329 A1   5/2012

OTHER PUBLICATIONS

PCT Search Report and Written Opinion for Appl No. PCT/US2018/060766 dated Apr. 9, 2019, 13 pages.

*Primary Examiner* — Paul M. West
*Assistant Examiner* — Mark A Shabman
(74) *Attorney, Agent, or Firm* — Maine Cernota & Rardin

(57) ABSTRACT

A capacitance measuring apparatus and method detects gas/liquid and liquid/gas transitions by monitoring a sensing capacitor having a gap in fluid communication with a monitored volume. The capacitor electrodes can be any arrangement that does not obstruct drainage, such as parallel plates or concentric cylinders. Embodiments have smooth and/or low wetting surfaces. Detection thresholds are automatically set to account for remnant drops and coatings of liquid, and can be automatically readjusted if additional liquid drains or a different liquid is introduced. Embodiments include an insulating layer to prevent conduction through a conductive liquid. A second capacitor can be included in series and/or the insulating layer can create a second virtual capacitor in series with the sensing capacitor gap to provide high sensitivity at low capacitance. The sensing capacitor can be combined in a cluster with a pressure sensor and/or temperature sensor.

19 Claims, 8 Drawing Sheets

(56) References Cited

U.S. PATENT DOCUMENTS

| | | |
|---|---|---|
| 2012/0017697 A1 | 1/2012 | Benzo et al. |
| 2012/0240675 A1* | 9/2012 | Farmanyan .......... G01F 23/263 73/304 C |
| 2013/0068015 A1* | 3/2013 | Sinha ................... G01F 23/263 73/304 C |
| 2014/0109684 A1 | 4/2014 | Sinha |
| 2016/0187179 A1* | 6/2016 | Hrncir .................. G01F 23/268 73/304 C |

* cited by examiner

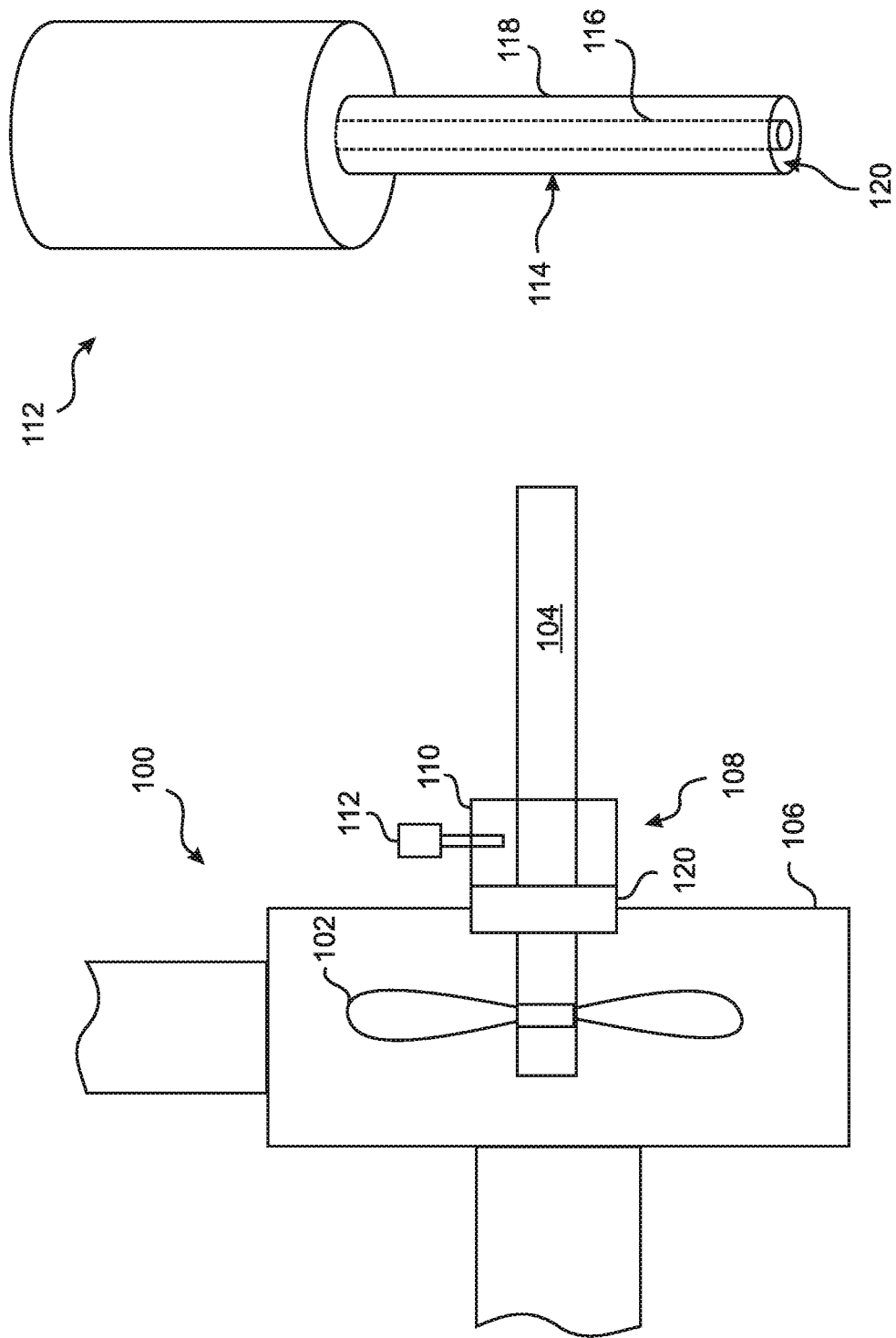

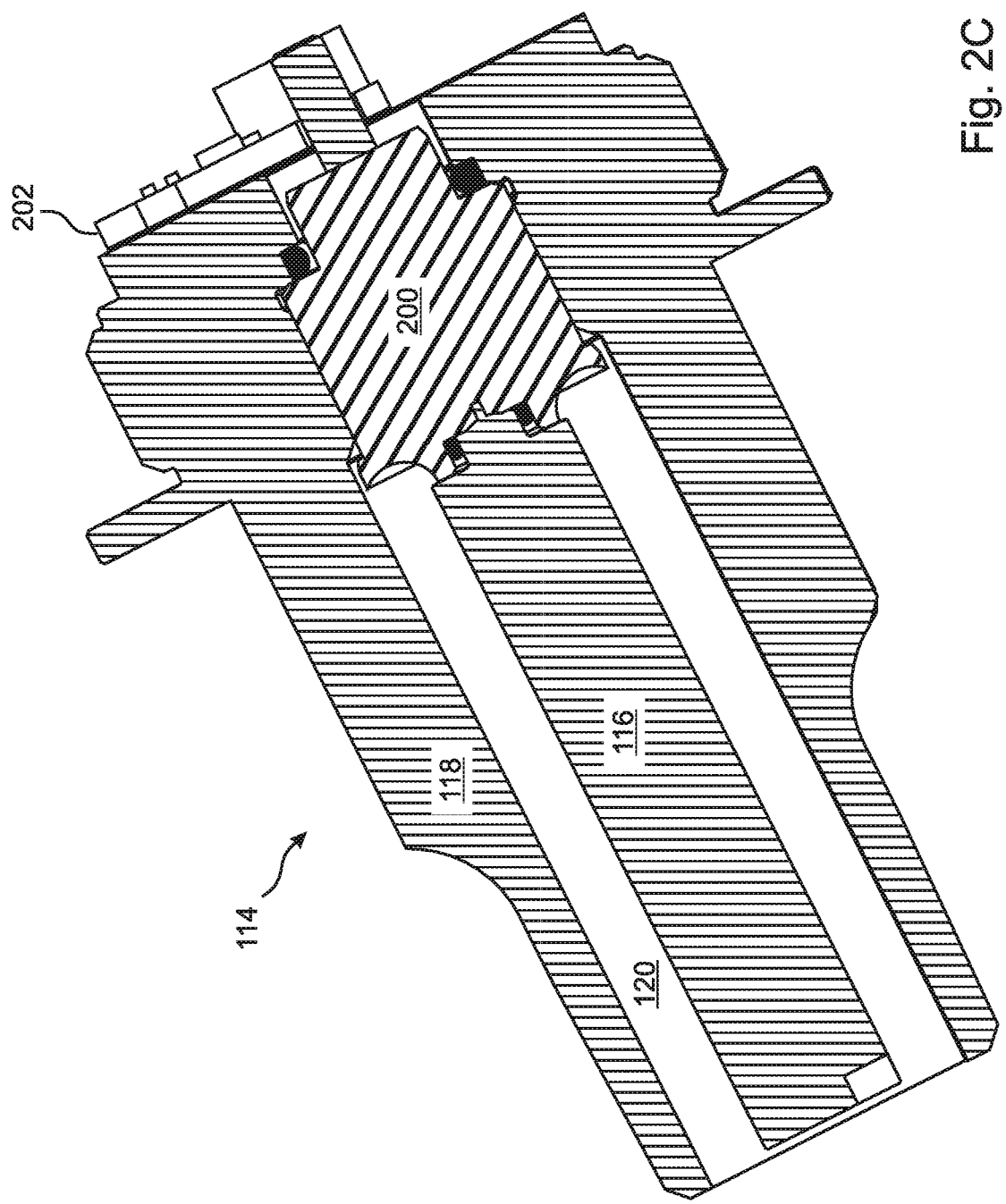

CAPACITANCE SENSING APPARATUS AND METHOD FOR DETECTING GAS-LIQUID TRANSITIONS

FIELD OF THE INVENTION

The invention relates to systems that contain, pump, circulate, and/or process fluids, and more particularly to sensors used for detecting gas/liquid transitions in system that contain, pump, circulate, and/or process fluids.

BACKGROUND OF THE INVENTION

In virtually all systems that contain, pump, circulate, or process fluids (referred to herein generically as fluid processing systems) there exist regions that are expected to be full of either a liquid or a gas during at least some phase of normal operation. Often, these regions are subject to gas/liquid or liquid/gas transitions, either during normal operation or due to failure conditions. For example, there may be regions within the system that are expected to be filled with liquid during a first phase of operation, and devoid of liquid during a second phase of operation. Or there may be a region that is normally full of air and separated from a process liquid by a seal, but may become filled with process liquid if the seal fails.

Accordingly, it is sometimes desirable to include a sensor within a fluid processing system that can detect gas-to-liquid (GTL) and/or liquid-to gas (LTG) transitions within a certain region, either for control of certain processes or for sensing of unexpected conditions that might indicate a fault or failure within the system.

Apparatus for sensing the presence and absence of liquids in a monitored volume range from float-based physical sensors, radar-based sensors, ultrasonic sensors, vibrating sensors, and optical sensors. However, these approaches typically consume large amounts of physical space, require an external power supply that provides a high current or voltage, require calibration, and/or are limited as to the type of liquid that can be detected. They also tend to be prohibitively expensive for many applications.

Capacitance is sometimes used for measuring the level of a liquid that partially fills a monitored volume. However these devices tend to require long immersion depths, large connection sizes, and external power supplies. Also, they tend to be limited to sensing liquid levels only of a specified liquid or for a narrow range of liquid types. Accordingly, this approach is often unsuitable for applications that require small size, self-contained power, and adaptability to a wide range of liquids.

What is needed, therefore, is an apparatus and method for detecting LTG and GTL transitions in a monitored volume, where the apparatus is small in size, has minimal power requirements, and is modest in cost, and the method and apparatus are adaptable during implementation and use for accurate sensing of transitions involving liquids having a wide variety of dielectric constants, viscosities, temperatures, and conductivities.

SUMMARY OF THE INVENTION

An apparatus and method are disclosed for detecting liquid-to-gas (LTG) and gas-to-liquid (GTL) transitions in a monitored volume, where the apparatus is small in size, has minimal power requirements, and in embodiments is modest in cost, and the method and apparatus are adaptable during implementation and use to accurate sensing of liquids having a wide variety of dielectric constants, viscosities, temperatures, and conductivities. In embodiments, the adaptation to different liquids is partially or wholly automated.

Reference is made herein to sensors and methods used in conjunction with mechanical seals. However, it will be understood that the present disclosure is applicable to virtually any circumstance where it is desirable to detect LTG and/or GTL transitions, and especially where the properties of the liquids are subject to wide variations, and where accurate sensing is required even after one or more LTG and/or GTL transitions have been experienced.

The disclosed apparatus includes a sensing capacitor formed by a separated pair of electrodes, wherein there is a gap between the electrodes into which gas or liquid from a monitored volume can enter. The electrodes of the sensing capacitor can be configured as concentric cylinders, parallel plates, or any other convenient geometry, so long as drainage of liquid from between the electrodes is not obstructed. The system monitors the capacitance of the sensing capacitor, and detects LTG and GTL transitions based on detected changes of the capacitance.

It is well known that the dielectric constants of most gasses deviate only slightly from air, while the dielectric constants of most liquids are at least twice as great as air, and can range up to values more than 80 times that of air (e.g. water) and even higher. Accordingly, if the present sensor were required only to detect a specific, well characterized liquid, or a narrow range of similar liquids, then little more would be required than to monitor the sensing capacitor and to set appropriate capacitance thresholds for detection of LTG and GTL transitions.

However, this simplistic approach would be likely to fail if a liquid was encountered by the sensor that fell outside of an expected range of properties. Problems arise, in particular, when there is a transition between a liquid-filled and gas-filled state (LTG transitions). For example, if a monitored volume is temporarily filled with a liquid having a high dielectric constant and then drained, the persistence of even a few droplets of the liquid within the sensing capacitor might still alter the capacitance of the sensing capacitor sufficiently to provide a false "positive" for presence of the liquid. This problem can be made even worse if the liquid has a high viscosity and/or high surface tension, such that a relatively large quantity of liquid remains as a coating on the surfaces of the sensing capacitor electrodes after the monitored volume has been drained.

The problem of avoiding false positives (and/or false negatives) becomes even more acute if a possibility exists that the monitored volume might be filled by different types of liquids. For example, if a certain volume that is normally filled with water is drained and subsequently filled with a low dielectric constant lubricating oil that has leaked from a seal or other component of the system, it might be difficult to detect the presence of the oil, because the resulting change in capacitance might be similar to the capacitance change that is caused by residual drops of water. Essentially the same problem arises when the type of liquid to be sensed is not known a-priori, or where the apparatus is subject to being moved between different systems that contain different types of liquids.

Accordingly, the disclosed apparatus and method include features that avoid, or at least mitigate, the likelihood of false positives and negatives even when transitions occur between liquid-filled and gas-filled states, even when the liquid filled states include states where the volume is filled by different liquids.

In particular, the disclosed method includes a calibration process whereby a "maximum" capacitance is measured by filling the sensing capacitor with the liquid to be sensed, and then a "baseline" capacitance is measured after the monitored volume is drained. Typically, the "baseline" value will be higher than the "minimum" value obtained from a truly empty capacitor, because residual droplets and/or a coating of the liquid will remain after the liquid is drained. Based on these measurements of the maximum and baseline values, a "gas-to-liquid" (GTL) detection threshold is set at a level that is well below the maximum value, but high enough above the baseline value to avoid false positives due to noise. In addition, a "liquid-to-gas" (LTG) threshold is set at a level that is well above the baseline, but sufficiently below the maximum value to avoid false positives. In some embodiments, the GTL threshold is below the LTG threshold, while in other embodiments they are the same threshold. Embodiments that set separate LTG and GTL thresholds can be preferred where the monitored volume is subject to being filled by different liquids having different dielectric constants. For example, if the sensor might be moved from one apparatus to another, or where there is a possibility of the monitored volume being filled by either process fluid or bearing lubricant.

Subsequently, if and when there is a GTL transition, a new "maximum" capacitance value is measured, and similarly a new "baseline" value is measured each time there is a LTG transition.

Once the system has been calibrated, it is able to detect either a loss of liquid in a normally liquid-filled volume (LTG event), or the presence of liquid in a normally gas-filled volume (GTL event). In some embodiments where the monitored volume is normally gas-filled, the system continues to monitor the capacitance of the sensing capacitor even if there is no GTL event detected. If the average value of the measured capacitance (i.e. the value excluding noise) decreases significantly over time, presumably due to further drainage of liquid droplets from the sensing capacitor, then the baseline and GTL threshold values are reduced accordingly, thereby minimizing any chance that a subsequent introduction of a lower dielectric constant liquid might go undetected.

In embodiments, the calibration process is at least partly automated, whereby the system assumes that the monitored volume is initially empty, and obtains an initial baseline capacitance measurement. When the system detects an increase in the capacitance beyond the noise, it assumes that the monitored volume has been filled with the liquid to be sensed, and measures a "maximum" capacitance value. Initial LTG detection threshold is then set at a value between the baseline and maximum values, typically at a level that is higher than the baseline value by an amount that is between one quarter and three-quarters of the difference between the baseline and maximum values. Upon detecting a reduction in the measured capacitance below the initial LTG threshold, the system assumes that the fluid has been drained from the monitored volume, but that some liquid may remain as droplets or a coating within the sensing capacitor. Accordingly, a new "baseline" capacitance value is obtained and the GTL threshold is reset, as described above.

If the monitored volume becomes filled with a "second" liquid having properties that differ substantially from the "first" liquid that was used for the initial calibration, embodiments are able to detect that a new "maximum" value has been detected, and are able to recalibrate the system accordingly.

As noted above, if the sensing capacitor is filled with a liquid having a high conductivity, then the sensing capacitor will have a complex impedance whereby the capacitance may be difficult to determine unless apparatus is included that can analyze the complex impedance and extract the reactive component therefrom. In some embodiments the system is able to determine the complex impedance of the sensing capacitor, and can extract the reactance and capacitance, therefrom. In other embodiments, a conventional capacitor is placed in series with the sensing capacitor, and/or at least one of the electrodes of the sensing capacitor is coated by or encased within an electrically insulating material, so that the impedance of the sensing capacitor remains substantially reactive, making it unnecessary to determine a complex impedance. This approach of including a second capacitance in series with the sensing capacitor enables embodiments of the present invention to reduce cost by using available sensor electronics, such as capacitive touch sensor integrated circuits, that are designed to sense changes in impedances that are primarily reactive.

In embodiments, the outer surfaces of the sensing capacitor electrodes, or the outer surfaces of the coatings or other materials applied to the sensing capacitor electrodes, are smooth and/or low in surface tension, so as to limit the amount of retained droplets as much as possible. Examples include fluoropolymers such as ETFE, PTFE, and Delrin. Accordingly, in some embodiments the coating serves the dual purpose of reducing "wetting" of the capacitor surfaces when a liquid is drained, as well as insulating the capacitor so that it cannot conduct electricity.

It is well known that the relative dielectric constants K of most gasses are below 2 (the dielectric constant of air being defined according to standard practice as being equal to 1), whereas the dielectric constants of liquids can range from about 2 to over 80. Therefore, precise determination of the capacitance of the sensing capacitor is most critical at low values of K. However, given the large range of K values for liquids, this can give rise to increased noise and loss of sensitivity, especially at lower capacitance values, as well as dynamic range issues for the sensor electronics. Including a separate capacitance in series with the sensing capacitor mitigates this problem in various embodiments.

In some of these embodiments, a layer of a solid material is included within the electrode gap of the sensing capacitor, typically as part of the electrically insulating barrier applied to at least one of the electrodes. From an electronic standpoint, a layer of solid material, referred to herein as a "dielectric layer," applied to an electrode of the sensing capacitor serves to divide the sensing capacitor into two virtual capacitors that are in series with each other, where the first virtual capacitor is filled with the dielectric layer and the second virtual capacitor is "filled" by the gap and available to be filled with gas or liquid according to the contents of the monitored volume.

Of course, if a plurality of dielectric layers or other exclusion regions is included in the gap, for example by applying layers of material to both of the electrodes, then the sensing capacitor will be divided into more than two virtual capacitors in series. And, of course, the application of a dielectric layer within the sensing capacitor can be combined with the addition of a series capacitor as a separate component. For clarity of explanation, the case of a single layer of material applied to a single electrode to create two virtual capacitors is discussed herein. Extension to more than two real and/or virtual capacitors is straightforward, and will be well understood by one of skill in the art.

By appropriate selection of the material and thickness of the dielectric layer, the capacitance of the first virtual capacitor can be adjusted so that it is roughly equal to the capacitance of the second virtual capacitor when the second virtual capacitor is filled with air. Typical capacitance ratios of the first capacitor divided by the second capacitor in embodiments are between 0.5 and 10. This has the effect of causing the capacitance of the sensing capacitor to be non-linear as a function of the dielectric constant of the gas or liquid that fills the gap, i.e. that fills the second virtual capacitor, whereby the change in the sensed capacitance is strongly dependent on the sensed material when the gas or liquid has a low dielectric constant, but asymptotically approaches the value of the "first" virtual capacitor when the gap is filled with a liquid having a high dielectric constant. This approach thereby maintains high sensitivity at low dielectric values, where it is most needed, while limiting the maximum capacitance when exposed to liquids having a high dielectric constant, and thereby increasing the sensitivity for low capacitance values, as well as reducing the dynamic range requirements imposed on the sensor electronics.

In embodiments, the sensing capacitor is incorporated into a sensor cluster that further includes a pressure sensor, and in embodiments also a temperature sensor. In some of these embodiments the sensing capacitor and pressure sensor are arranged one behind the other so as to minimize the attachment footprint of the sensor cluster, and a fluid bypass is provided so that the gas or liquid within the monitored volume can reach both of the sensors.

A first general aspect of the present invention is an apparatus for detecting transitions of a monitored volume between a liquid filled state and a gas-filled state. The apparatus includes a sensing capacitor having a separated pair of electrodes and a gap therebetween, the sensing capacitor being configured to cause the gap to be filled by a fluid contained within the monitored volume, and capacitance measuring electronics configured to measure a maximum capacitance of the sensing capacitor when the gap of the sensing capacitor is filled by a liquid, measure a baseline capacitance of the sensing capacitor after the liquid has been drained from the gap of the sensing capacitor, determine a gas-to-liquid (GTL) transition threshold capacitance and a transition liquid-to-gas (LTG) capacitance according to the measured maximum and baseline capacitances, and provide an output indicating that a GTL or LTG transition has occurred if the capacitance of the sensing capacitor crosses above the GTL threshold capacitance or below the LTG threshold capacitance, respectively.

In embodiments, the electrodes are configured as parallel plates.

In any of the above embodiments, the electrodes can be configured as concentric cylinders.

In any of the above embodiments, the capacitance measuring electronics can be configured to determine a complex impedance of the sensing capacitor, and to extract therefrom a capacitance of the sensing capacitor according to a reactive component of the complex impedance.

Any of the above embodiments can further include an electrically insulating material applied to at least one of the electrodes and configured to ensure that the impedance of the sensing capacitor is substantially reactive, even if the gap of the sensing capacitor is filled with a conductive liquid.

Any of the above embodiments can further include a current-blocking capacitor arranged electrically in series with the sensing capacitor and configured to ensure that the impedance of the combined sensing and current-blocking capacitors is substantially reactive, even if the gap of the sensing capacitor is filled with a conductive liquid.

Any of the above embodiments can further include an exclusion region between the electrodes into which gas and liquid from the monitored volume cannot enter, the sensing capacitor being electrically equivalent to a series combination of at least two virtual capacitors, where at least one of the virtual capacitors is filled by the exclusion region. In some of these embodiments, the exclusion region is created by a layer of dielectric material that is applied to one of the electrodes of the sensing capacitor and configured to ensure that the impedance of the sensing capacitor is substantially reactive, even if the gap is filled with a conductive liquid. And in some of these embodiments, the sensing capacitor is divided by the layer of dielectric material into two virtual capacitors, one of which is filled by the layer of insulating material, and the other of which is filled by the gap.

Any of the above embodiments can further include a pressure sensor configured to sense a pressure of a fluid contained within the monitored volume. In some of these embodiments, the pressure sensor is located behind the sensing capacitor, so that the sensing capacitor is between the pressure sensor and the monitored volume, a fluid bypass being provided so as to allow fluid from the monitored volume to reach the pressure sensor. In other of these embodiments, the pressure sensor is located in front of the sensing capacitor, so that the pressure sensor is between the sensing capacitor and the monitored volume, a fluid bypass being provided so as to allow fluid from the monitored volume to reach the sensing capacitor.

Any of the above embodiments can further include a temperature sensor configured to sense a temperature of a fluid contained within the monitored volume.

A second general aspect of the present invention is a method for detecting transitions of a monitored volume between a liquid filled state and a gas-filled state. The method includes providing a sensing capacitor having a separated pair of electrodes and a gap therebetween, the sensing capacitor being configured to cause the gap to be filled by a fluid contained within the monitored volume, calibrating the sensing capacitor by measuring a maximum capacitance of the sensing capacitor when the gap of the sensing capacitor is filled by a liquid, measuring a baseline capacitance of the sensing capacitor after the liquid has been drained from the gap of the sensing capacitor, and determining a gas-to-liquid (GTL) threshold capacitance and a liquid-to-gas (LTG) threshold capacitance according to the measured maximum and baseline capacitances, and providing an output indicating that a GTL or LTG transition has occurred if the capacitance of the sensing capacitor crosses above the GTL threshold capacitance or below the LTG threshold capacitance, respectively.

In embodiments, the step of calibrating the sensing capacitor is performed automatically and without user interaction.

In any of the above embodiments, measuring the maximum and baseline capacitances can include determining a complex impedance of the sensing capacitor, and extracting therefrom a capacitance of the sensing capacitor according to a reactive component of the complex impedance.

Any of the above embodiments can further include, before the gap of the sensing capacitor is filled with the liquid, the gap being devoid of substantially all traces of liquid, determining a minimum capacitance of the sensing capacitor.

Any of the above embodiments can further include revising at least one of the GTL and LTG threshold capacitances upon detecting a GTL or an LTG transition.

And any of the above embodiments can further include, while the monitored volume is in a gas-filled state after having been filled with liquid: periodically measuring the capacitance of the sensing capacitor, and if the measured capacitance falls by more than a specified amount, correspondingly reducing the GTL threshold capacitance.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1A is a simplified cross-sectional illustration of a centrifugal pump having a rotating shaft sealed by a mechanical seal, and including a monitored volume and a gas/liquid transition sensing apparatus according to an embodiment of the present invention;

FIG. 1B is an enlarged view of the sensing apparatus of FIG. 1A;

FIG. 2C is an assembled cross-sectional view drawn to scale of the embodiment of FIG. 2B;

DETAILED DESCRIPTION

Figure 2A:
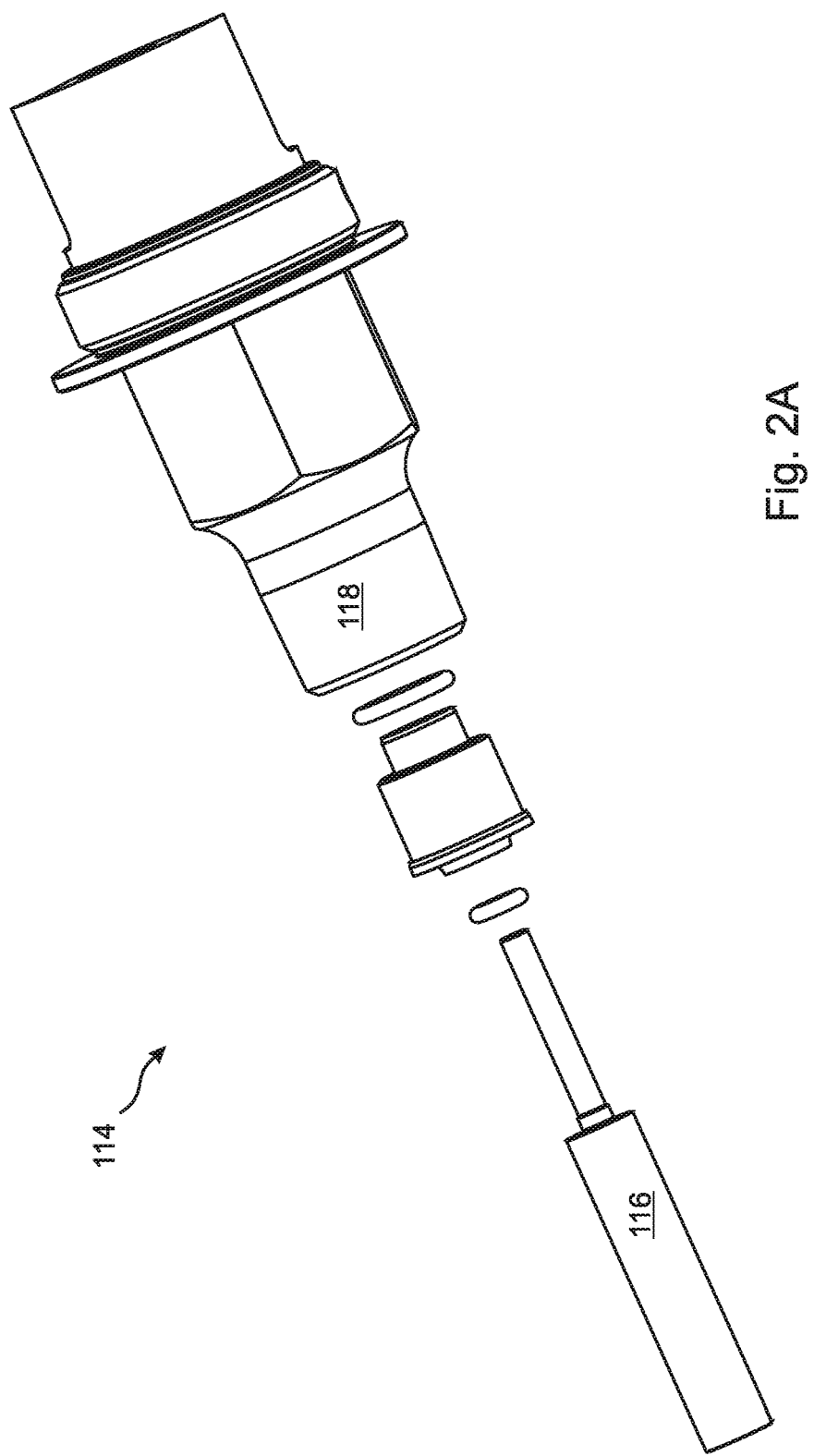
FIG. 2A is a perspective, exploded view drawn to scale of a sensing capacitor according to an embodiment of the invention.

The present invention is an apparatus and method for detecting liquid-to-gas (LTG) and gas-to-liquid (GTL) transitions in a monitored volume, where the apparatus is small in size, has minimal power requirements, and in embodiments is modest in cost, and the method and apparatus are adaptable during implementation and use to accurate sensing of liquids having a wide variety of dielectric constants, viscosities, temperatures, and conductivities. In embodiments, the adaptation to different liquids is partially or wholly automated.

Embodiments of the invention are applicable to sensors and methods used in conjunction with mechanical seals. For example, FIG. 1A is a simplified illustration of a centrifugal pump 100 that includes an impeller 102 driven by a rotating shaft 104 that passes through the pump housing 106, whereby a seal 108 is used to prevent process liquid from leaking out of the housing 106 around the shaft 104. Seals however can wear, and so in the simplified illustration of FIG. 1 the seal 108 includes a gland or other enclosed, monitored volume 110 on the outer side of the seal faces 120, where any leaking process liquid will be collected. A sensor 112 according to the present invention is provided so as to detect the presence of process liquid within the monitored volume 110 (GTL transition), so as to alert operators as to an impending failure of the seal 108.

With reference to FIG. 1B, the disclosed apparatus 112 includes a sensing capacitor 114 formed by a separated pair of electrodes 116, 118, wherein there is a gap 120 between the electrodes 116, 118 into which gas or liquid from a monitored volume 110 can enter. In the embodiment of FIG. 1B, the electrodes 116, 118 of the sensing capacitor 114 are configured as concentric cylinders. In other embodiments, they are configured as parallel plates, or in any other convenient geometry, so long as drainage of liquid from between the electrodes 116, 118 is not obstructed. The disclosed system monitors the capacitance of the sensing capacitor 114, and determines the presence or absence of liquid within the monitored volume 110 based on detected changes of the capacitance.

The example of FIGS. 1A and 1B are presented with reference to detecting leakage from a mechanical seal. However, it will be understood that the present disclosure is applicable to virtually any circumstance where it is desirable to detect GTL and/or LTG transitions, and especially where the properties of the liquids are subject to wide variations, and where accurate sensing is required even after one or more GTL/LTG transitions have been experienced.

Figure 2B:
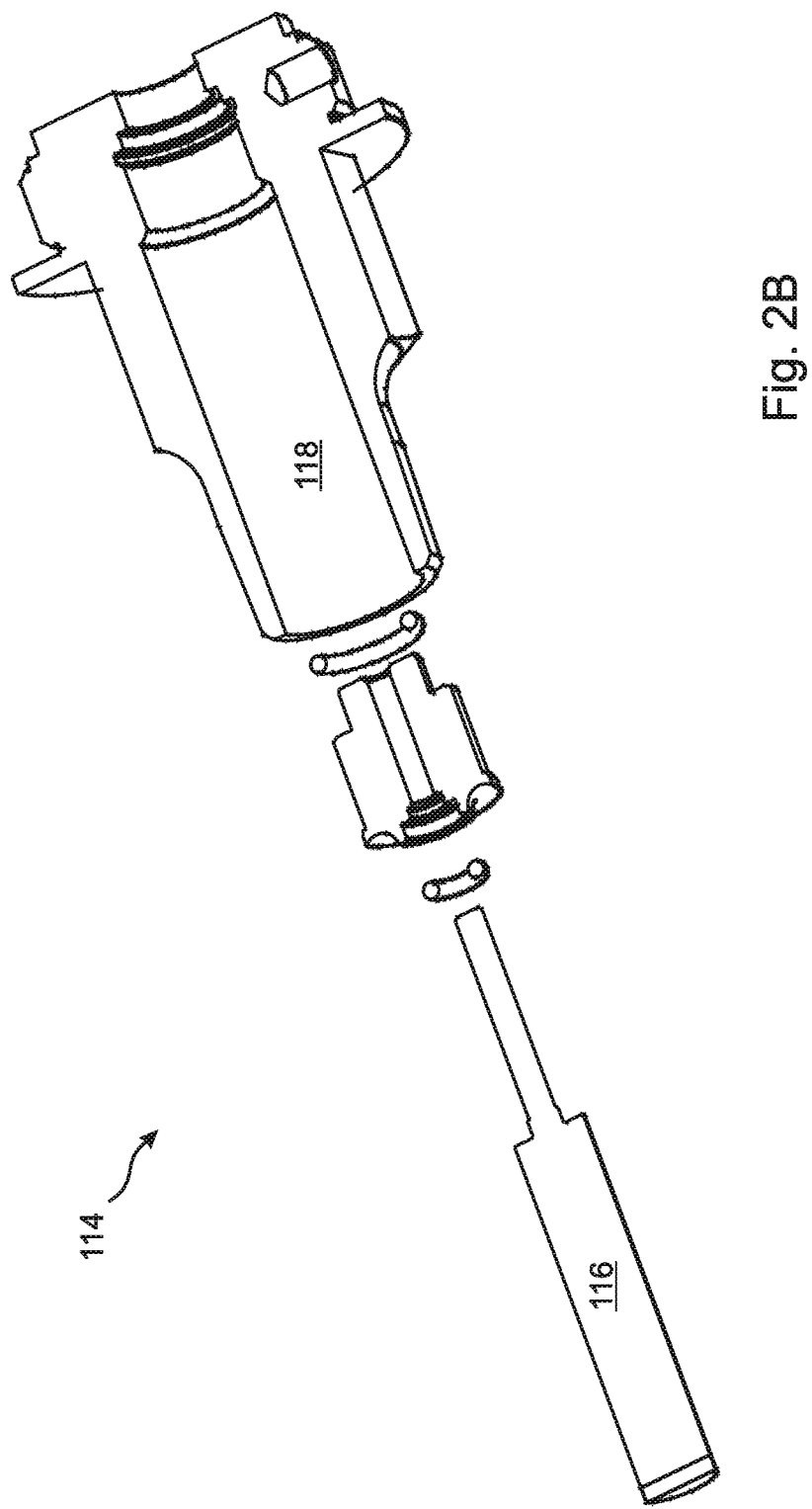
FIG. 2B is an exploded cross-sectional view drawn to scale of the embodiment of FIG. 2A.

FIG. 2A is an exploded perspective view drawn to scale of a sensing capacitor 114 in an embodiment of the invention, and FIG. 2B is a cross sectional exploded view drawn to scale of the embodiment of FIG. 2A. FIG. 2C illustrates the sensing capacitor of FIGS. 2A and 2B in an assembled configuration, drawn to scale. In this embodiment, the sensing capacitor 114 is formed by an outer housing 118, which is grounded, and a solid inner cylinder 116, both of which are made from a metal such as stainless steel. The inner cylinder 116 is held in place within a cylindrical chamber of the housing 118 by a plug 200 made of an electrically insulating material having a dielectric constant less than 20, such as glass-filled PTFE (Teflon).

The construction in this embodiment ensures that the electrodes 116, 118 are held rigidly in place, and do not move significantly even in the presence of changing temperatures, variable humidity, or mechanical vibrations. With reference to FIG. 2C, the electronic measurement circuitry 202 is mounted on top of the housing 118, and connected directly to an upper end of the inner sensing capacitor electrode 116. Locating the electronics 202 as close as possible to the sensor cavity 120 in this manner helps to minimize stray capacitance and reduce noise pickup of electrical leads between the electronics 202 and the sensing capacitor 114.

It is well known that the dielectric constants of most liquids are at least twice as great as air, and can range up to values more than 80 times that of air (e.g. water) and even higher. Accordingly, if the present sensor were required only to detect a specific, well characterized liquid, or a narrow range of similar liquids, then little more would be required than to monitor the sensing capacitor and to set appropriate capacitance thresholds for detection of the presence or absence of the liquid.

However, this simplistic approach would be likely to fail if a liquid was encountered by the sensor that fell outside of an expected range of properties. Problems arise, in particular, when there is a transition between a liquid-filled and gas-filled state. For example, if a monitored volume is temporarily filled with a liquid having a high dielectric constant and then drained, the persistence of even a few droplets of the liquid within the sensing capacitor might still alter the capacitance of the sensing capacitor sufficiently to provide a false "positive" for presence of the liquid, or to provide a false negative for the presence of a different liquid having a lower dielectric constant. This problem can be made even worse if the liquid has a high viscosity and/or high surface tension, such that a relatively large quantity of liquid remains as a coating on the surfaces of the sensing capacitor electrodes after the monitored volume has been drained.

The problem of avoiding false positives (and/or false negatives) becomes even more acute if a possibility exists that the monitored volume might be filled by different types of liquids. For example, if a certain volume that is normally filled with water is drained and subsequently filled with a low dielectric constant lubricating oil that has leaked from a seal or other component of the system, it might be difficult to detect the presence of the oil, because the resulting change in capacitance might be similar to the capacitance change that is caused by residual drops of water. Similar issues arise if the sensor is removed from a first application and re-deployed in a second application where a different liquid is present.

Accordingly, the disclosed apparatus and method include features that avoid, or at least mitigate, the likelihood of false positives and negatives even when transitions occur between liquid-filled and gas-filled states, even when the liquid filled states include states where the volume is filled by different liquids.

Figure 3:
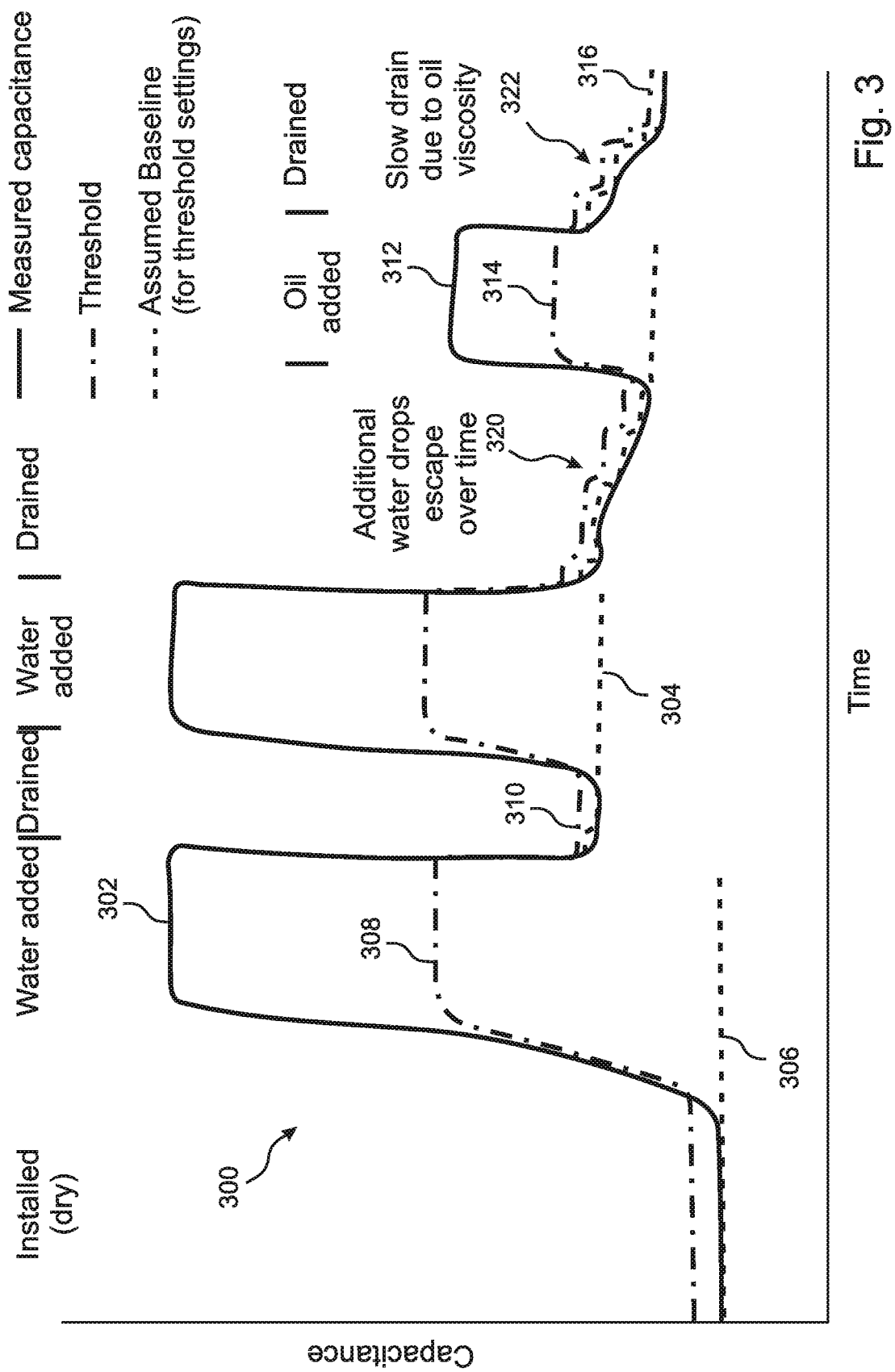
FIG. 3 is a chart that illustrates a method of calibrating gas/liquid sensing apparatus in an embodiment of the present invention.

In particular, with reference to FIG. 3, the disclosed method includes a calibration process 300 whereby a "maximum" capacitance 302 is measured by filling the sensing capacitor 114 with the liquid to be sensed, and then a "baseline" capacitance 304 is measured after the monitored volume is drained. Typically, the "baseline" value 304 will be higher than the "minimum" value 306 obtained from a truly empty sensing capacitor 114, because residual droplets and/or a coating of the liquid will remain after the liquid is drained. Based on these measurements of the maximum 302 and baseline 304 values, a "gas-to-liquid" (GTL) detection threshold 310 is set at a level that is well below the maximum 302 value, but high enough above the baseline value 304 to avoid false positives due to noise. In addition, a "liquid-to-gas" (LTG) threshold 308 is set at a level that is well above the baseline 304, but sufficiently below the maximum value 302 to avoid false positives. In the example of FIG. 3, the GTL threshold 310 is below the LTG threshold 308, while in other embodiments they are at the same level. Embodiments that set separate LTG 308 and GTL 310 thresholds can be preferred where the monitored volume 110 is subject to being filled by different liquids having different dielectric constants. For example, FIG. 3 illustrates an example where the monitored volume 110 is initially filled with water 302, and then subsequently filled with oil 312, after which a new "maximum" capacitance value is measured 312, and a new "baseline" value is measured 316, and new LTG 314 and GTL 318 thresholds are established. In embodiments, the maximum, baseline, and threshold values are reset each time there is an LTG or GTL transition.

In some embodiments where the monitored volume is normally gas-filled, the system continues to monitor the capacitance of the sensing capacitor 114. As can be seen in FIG. 3, the measured capacitance can continue to decline as additional water droplets fall out of the capacitor or evaporate 320. This process can be even slower for more viscous liquids such as oil, as shown in the FIG. 322. If the average value of the measured "baseline" capacitance (i.e. the value excluding noise) 304 decreases significantly over time, presumably due to further drainage of liquid droplets from the sensing capacitor 114, then the baseline 304 and GTL threshold 310 values are reduced accordingly, thereby minimizing any chance that a subsequent introduction of a lower dielectric constant liquid might go undetected.

In embodiments, the calibration process is at least partly automated, whereby the system assumes that the monitored volume is initially empty, and obtains an initial "minimum" capacitance 306 measurement, which is used to set an initial GTL threshold. When the system detects an increase in the capacitance beyond the initial GTL threshold, it assumes that the monitored volume has been filled with the liquid to be sensed, and measures the "maximum" capacitance value 302. An initial LTG detection threshold 308 is then set at a value between the minimum 306 and maximum 302 values, typically at a level that is higher than the minimum value 306 by an amount that is between one quarter and three-quarters of the difference between the maximum 302 and minimum 306 values. Upon detecting a reduction in the measured capacitance below this initial threshold 308, the system assumes that the fluid has been drained from the monitored volume 110, but that some liquid may remain as droplets 320 or a coating 322 within the sensing capacitor 114. Accordingly, a "baseline" capacitance value 304 is obtained and a GTL threshold is set to a value 310 that is high enough to be above the baseline plus noise, but typically lower than the LTG threshold 308.

If the monitored volume becomes filled with a "second" liquid having properties that differ substantially from the "first" liquid that was used for calibration, as illustrated in FIG. 3 at 312, embodiments are able to detect that a new "maximum" value 312 has been detected, and are able to recalibrate the system accordingly.

If gap 120 in the sensing capacitor 114 is filled with a liquid having a high conductivity, then the sensing capacitor 114 will have a complex impedance, whereby the capacitance may be difficult to determine unless apparatus is included that can analyze the complex impedance and extract the reactive component therefrom.

In some embodiments the system is able to determine the complex impedance of the sensing capacitor, and can extract the reactance and capacitance, therefrom. In other embodiments, a "blocking" capacitor is placed in series with the sensing capacitor, and/or at least one of the electrodes of the sensing capacitor is coated by or encased within an electrically insulating material, so that the impedance of the sensing capacitor, or of the combined sensing capacitor and blocking capacitor, remains substantially reactive, making it unnecessary to determine a complex impedance. This approach of including a real or virtual second capacitance in series with the gap of the sensing capacitor enables embodiments of the present invention to reduce cost by using available sensor electronics, such as capacitive touch sensor integrated circuits, that are designed to sense changes in impedances that are primarily reactive.

Figure 4:
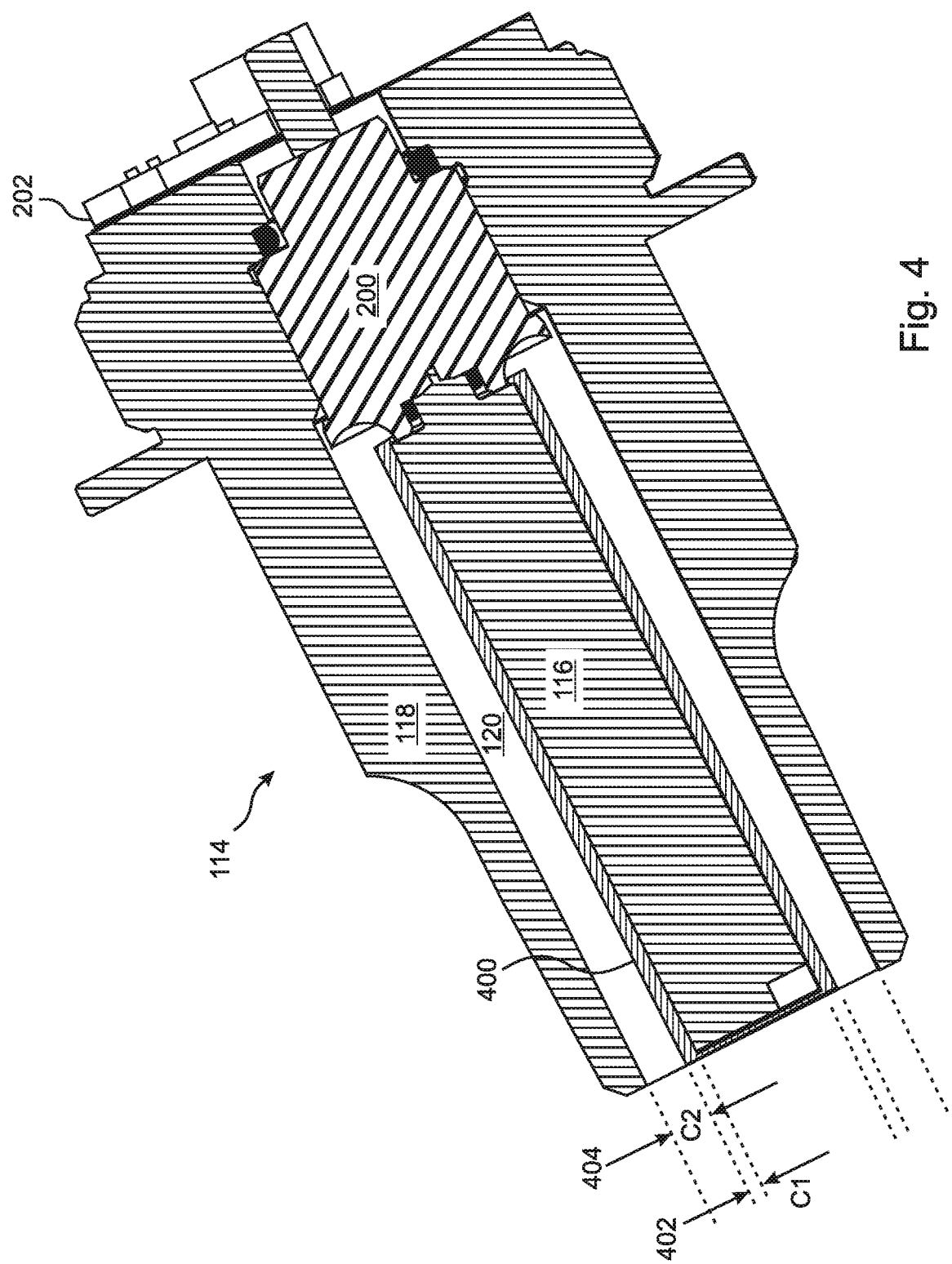
FIG. 4 is an assembled cross-sectional view drawn to scale of an embodiment similar to FIG. 2C, but including a dielectric layer applied to the inner electrode that electrically insulates the inner electrode and divides the sensing capacitor into two virtual capacitors.

FIG. 4 illustrates an embodiment similar to the embodiment of FIGS. 2A-2C, but including an insulating layer 400 applied to the surface of the inner capacitor 116 so as to insulate the electrode 116 from an electrically conductive process liquid. In embodiments, the insulating material is made of a fluoropolymer such as ETFE, PTFE or Delrin.

In embodiments, the outer surfaces of the sensing capacitor electrodes 116, 118, and/or the outer surfaces of the coatings 400 or other materials applied to the sensing capacitor electrodes 116, 117, are smooth and/or low in surface tension, so as to limit the amount of retained droplets as much as possible. Accordingly, in some embodiments the coating serves the dual purpose of reducing "wetting" of the capacitor surfaces when a liquid is drained, as well as insulating the capacitor so that it cannot conduct electricity.

It is well known that the relative dielectric constants K of most gasses are below 2 (the dielectric constant of air being defined according to standard practice as being equal to 1), whereas the dielectric constants of liquids can range from about 2 to over 80. Therefore, precise determination of the capacitance of the sensing capacitor is most critical at low values of K. However, K values for liquids can be very large. It is necessary that the sensor electronics 202 be able to sense at least 50% of the maximum capacitance of the sensing capacitor 114 when it is filled with a liquid having the highest anticipated value of K, and preferably the sensing electronics 202 should be able to sense 100% of this maximum capacitance value. These requirements can give rise to increased noise and loss of sensitivity, especially at lower capacitance values, as well as dynamic range issues for the sensor electronics. Including a separate capacitance in series with the sensing capacitor mitigates this problem in various embodiments.

Accordingly, with reference again to FIG. 4, embodiments of the present invention include a layer of dielectric material 400 within the electrode gap 120 of the sensing capacitor 114, typically as part of the electrically insulating barrier 400 applied to at least one of the electrodes 116. From an electronic standpoint, this layer of dielectric material 400 serves to divide the sensing capacitor 114 into two virtual capacitors 402 404 that are in series with each other, where the first virtual capacitor 402 is filled with the dielectric layer 400 and the second virtual capacitor 404 is available to be filled with gas or liquid according to the contents of the monitored volume.

Of course, if a plurality of dielectric layers is included in the gap 120, then the sensing capacitor 114 is divided into more than two virtual capacitors that are in series. And, of course, the application of a dielectric layer within the sensing capacitor can be combined with the addition of a series capacitor as a separate component. However, for clarity of explanation the case of a single dielectric layer 400 is discussed herein. Extension to more than two real and/or virtual capacitors is straightforward for one of skill in the art.

By appropriate selection of the material and thickness of the dielectric layer 400, the capacitance C1 of the first virtual capacitor 402 can be adjusted so that it is roughly equal to the capacitance C2 of the second virtual capacitor 404 when the gap 120 in the second virtual capacitor 404 is filled with air. Typical capacitance ratios C1/C2 of the first capacitor 402 divided by the air-filled second capacitor 404 in embodiments are between 0.5 and 10. This has the effect of causing the capacitance of the sensing capacitor 114 as a whole to be non-linear as a function of the dielectric constant of the gas or liquid that fills the gap 120, i.e. the fills the second virtual capacitor 404.

Figure 5:
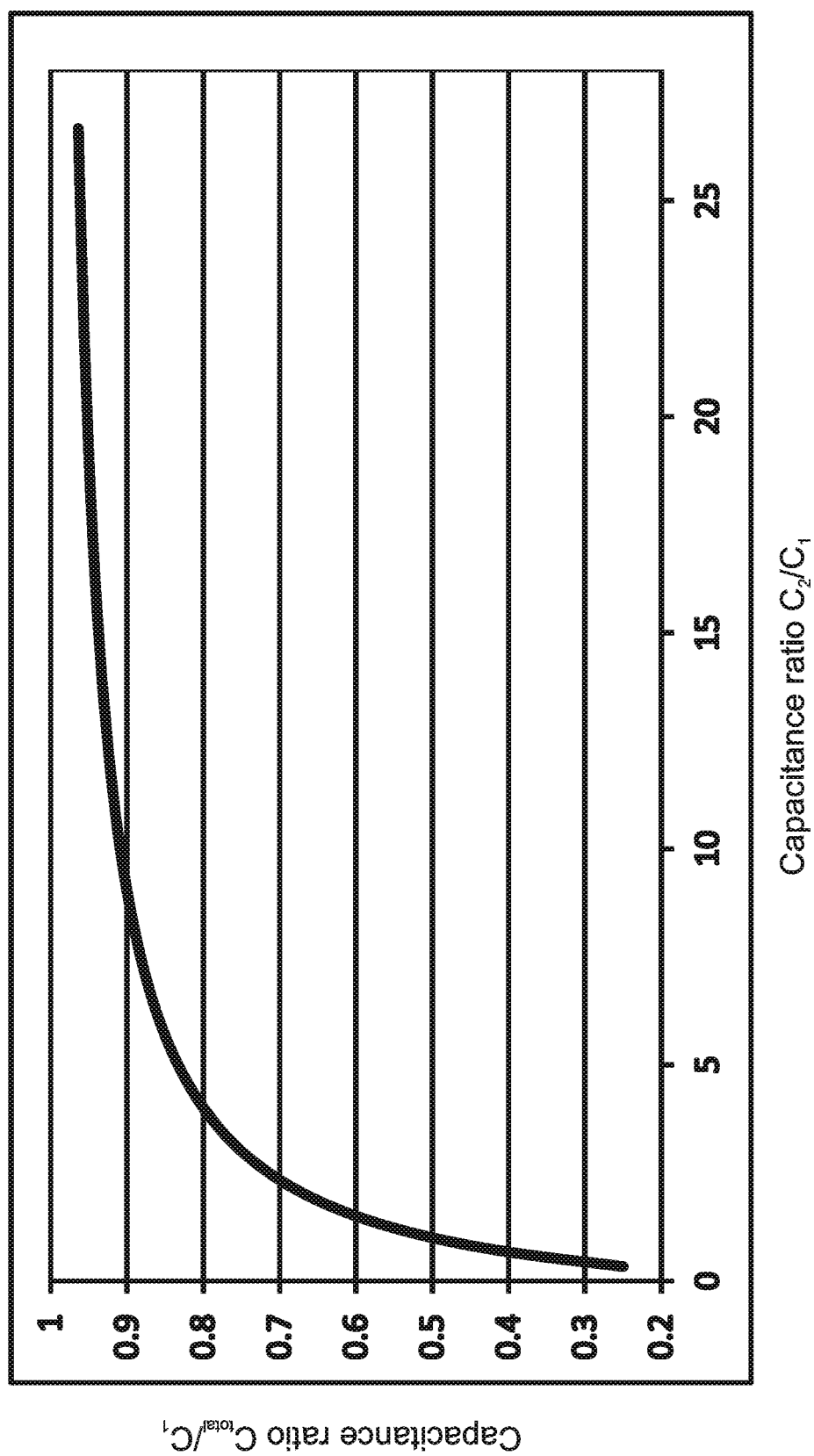
FIG. 5 is a graph that presents a calculated relationship between overall capacitance and liquid dielectric constant for the sensing capacitor of FIG. 4.

An example is given in the graph of FIG. 5, which presents a calculation of the capacitance of the sensing capacitor 114 as a function of the dielectric constant of the substance filling the gap 120 in the second virtual capacitor 404. The capacitance values presented in FIG. 5 are normalized to the capacitance of C1 the first virtual capacitor 402, and assume that the capacitance C2 of the second capacitor 404 is one third as large as the capacitance C1 of the first capacitor 402 when the gap 120 in the second virtual capacitor 404 is filled with air. As the dielectric constant of the liquid filling the gap 120 in the second virtual capacitor 404 increases, the capacitance C2 of the second virtual capacitor 404 increases to a value that is more than 25 times as large as the capacitance of the first virtual capacitor 402. However, the capacitance of the sensing capacitor 114 is not able to exceed C1. As a result, sensitivity of the measured capacitance of the sensing capacitor 114 to small changes in the dielectric constant of the process liquid is high when the dielectric constant of the process liquid is small, which is where the sensitivity is most needed, while the dynamic range requirement placed on the sensor electronics 202 is greatly reduced.

Figure 6:
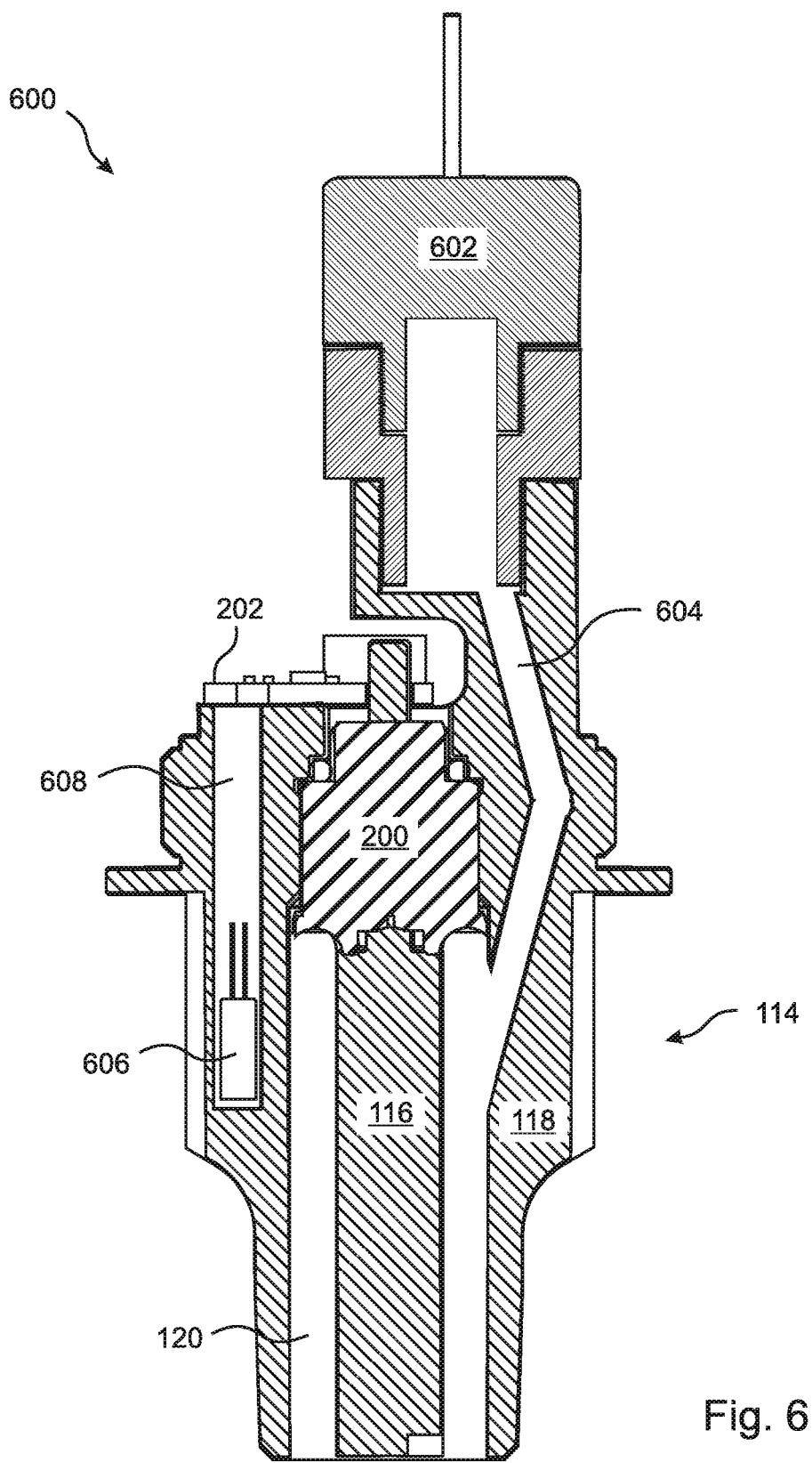
FIG. 6 is a cross-sectional view of a sensor cluster embodiment that includes a sensing capacitor, a pressure sensor, and a temperature sensor.

With reference to FIG. 6, in embodiments, the sensing capacitor 114 is incorporated into a sensor cluster 600 that further includes a pressure sensor 602. In the embodiment of FIG. 6 the sensing capacitor 114 and pressure sensor 602 are arranged one behind the other so as to minimize the attachment footprint of the sensor cluster 600, and a fluid bypass 604 is provided in the cluster 600 so that the gas or liquid within the monitored volume can reach both of the sensors 114, 602. In the embodiment of FIG. 6, the sensor cluster 600 further includes a temperature sensor 606 that is located within a chamber 608 provided in the housing 118 of the sensing capacitor 114.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications without departing from the spirit thereof. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

DEFINITIONS

The term "electrically insulating" is used herein to refer to materials that have a resistivity of greater than one ohm meter.

The term "dielectric material" is used herein to refer to any material that is electrically insulating and is not permeable to gas or liquid contained in the monitored volume.

We claim:

1. An apparatus for detecting transitions of a monitored volume between a liquid filled state and a gas-filled state, the apparatus comprising:
   a sensing capacitor having a separated pair of electrodes and a gap therebetween; and capacitance measuring electronics configured to automatically:
  measure a maximum capacitance of the sensing capacitor when the gap of the sensing capacitor is filled by a liquid;
  measure a baseline capacitance of the sensing capacitor after the liquid has been drained from the gap of the sensing capacitor; and
  determine a gas-to-liquid (GTL) transition threshold capacitance and a transition liquid-to-gas (LTG) capacitance according to the measured maximum and baseline capacitances;
the capacitance measuring electronics being further configured to provide an output indicating that a GTL or LTG transition has occurred if the capacitance of the sensing capacitor crosses above the GTL threshold capacitance or below the LTG threshold capacitance, respectively.

2. The apparatus of claim 1, wherein the electrodes are configured as parallel plates.

3. The apparatus of claim 1, wherein the electrodes are configured as concentric cylinders.

4. The apparatus of claim 1, wherein the capacitance measuring electronics are configured to determine a complex impedance of the sensing capacitor, and to extract therefrom a capacitance of the sensing capacitor according to a reactive component of the complex impedance.

5. The apparatus of claim 1, further comprising an electrically insulating material applied to at least one of the electrodes and configured to ensure that the impedance of the sensing capacitor is substantially reactive, even if the gap of the sensing capacitor is filled with a conductive liquid.

6. The apparatus of claim 1, further comprising a current-blocking capacitor arranged electrically in series with the sensing capacitor and configured to ensure that the impedance of the combined sensing and current-blocking capacitors is substantially reactive, even if the gap of the sensing capacitor is filled with a conductive liquid.

7. The apparatus of claim 1, further comprising an exclusion region between the electrodes into which gas and liquid from the monitored volume cannot enter, the sensing capacitor being electrically equivalent to a series combination of at least two virtual capacitors, where at least one of the virtual capacitors is filled by the exclusion region.

8. The apparatus of claim 7, wherein the exclusion region is created by a layer of dielectric material that is applied to one of the electrodes of the sensing capacitor and configured to ensure that the impedance of the sensing capacitor is substantially reactive, even if the gap is filled with a conductive liquid.

9. The apparatus of claim 8, wherein the sensing capacitor is divided by the layer of dielectric material into two virtual capacitors, one of which is filled by the layer of insulating material, and the other of which is filled by the gap.

10. The apparatus of claim 1, further comprising a pressure sensor configured to sense a pressure of a fluid contained within the monitored volume.

11. The apparatus of claim 10, wherein the pressure sensor is located behind the sensing capacitor, so that the sensing capacitor is between the pressure sensor and the monitored volume, a fluid bypass being provided so as to allow fluid from the monitored volume to reach the pressure sensor.

12. The apparatus of claim 10, wherein the pressure sensor is located in front of the sensing capacitor, so that the pressure sensor is between the sensing capacitor and the monitored volume, a fluid bypass being provided so as to allow fluid from the monitored volume to reach the sensing capacitor.

13. The apparatus of claim 1, further comprising a temperature sensor configured to sense a temperature of a fluid contained within the monitored volume.

14. A method for detecting transitions of a monitored volume between a liquid filled state and a gas-filled state, the method comprising:
  providing a sensing capacitor having a separated pair of electrodes and a gap therebetween;
  calibrating the sensing capacitor by:
    measuring a maximum capacitance of the sensing capacitor when the gap of the sensing capacitor is filled by a liquid;
    measuring a baseline capacitance of the sensing capacitor after the liquid has been drained from the gap of the sensing capacitor; and
    determining a gas-to-liquid (GTL) threshold capacitance and a liquid-to-gas (LTG) threshold capacitance according to the measured maximum and baseline capacitances; and
  providing an output indicating that a GTL or LTG transition has occurred if the capacitance of the sensing capacitor crosses above the GTL threshold capacitance or below the LTG threshold capacitance, respectively.

15. The method of claim 14, wherein the step of calibrating the sensing capacitor is performed automatically and without user interaction.

16. The method of claim 14, wherein measuring the maximum and baseline capacitances includes determining a complex impedance of the sensing capacitor, and extracting therefrom a capacitance of the sensing capacitor according to a reactive component of the complex impedance.

17. The method of claim 14, further comprising, before the gap of the sensing capacitor is filled with the liquid, the gap being devoid of substantially all traces of liquid, determining a minimum capacitance of the sensing capacitor.

18. The method of claim 14, further comprising revising at least one of the GTL and LTG threshold capacitances upon detecting a GTL or an LTG transition.

19. The method of claim 14, further comprising, while the monitored volume is in a gas-filled state after having been filled with liquid:
  periodically measuring the capacitance of the sensing capacitor; and
  if the measured capacitance falls by more than a specified amount, correspondingly reducing the GTL threshold capacitance.

* * * * *